United States Patent [19]

Tu et al.

[11] Patent Number: 5,241,195
[45] Date of Patent: Aug. 31, 1993

[54] MERGED P-I-N/SCHOTTKY POWER RECTIFIER HAVING EXTENDED P-I-N JUNCTION

[75] Inventors: Shang-hui L. Tu, Chandler, Ariz.; Bantval J. Baliga, Raleigh, N.C.

[73] Assignee: North Carolina State University at Raleigh, Raleigh, N.C.

[21] Appl. No.: 929,786

[22] Filed: Aug. 13, 1992

[51] Int. Cl.[5] .......................................... H01L 29/48
[52] U.S. Cl. .................... 257/155; 257/260; 257/485; 257/156; 257/476
[58] Field of Search ............... 257/155, 260, 471, 475, 257/476, 485, 109, 156, 622

[56] References Cited

U.S. PATENT DOCUMENTS

| | | | |
|---|---|---|---|
| 4,720,734 | 1/1988 | Amemiya et al. | 257/485 X |
| 4,837,608 | 6/1989 | Nishizawa et al. | 257/485 X |
| 4,982,260 | 1/1991 | Chang et al. | 357/38 |
| 5,101,244 | 3/1992 | Mori et al. | 257/260 X |

OTHER PUBLICATIONS

*Reactive Ion Etching of Silicon Trenches Using $SF_6/O_2$ Gas Mixtures,* Syau et al., J. Electrochem. Soc., vol. 138, No. 10, Oct. 1991, pp. 3076–3081.
*Optimization of the MPS Rectifier Via Variation of Schottky Region Area,* Tu et al., Proceedings of the 3rd International Symposium on Power Semiconductor Devices and ICs, Apr. 22-24, 1991, pp. 109–112.
*The Theory and Practice of Microelectronics,* S. K. Ghandhi, John Wiley & Sons, Inc., 1968, pp. 91–97.
*Modern Power Devices,* B. J. Baliga, John Wiley & Sons, Inc., 1987, pp. 263–343.
*Analysis of a High-Voltage Merged p-i-n/Schottky (MPS) Rectifier,* B. J. Baliga, IEEE Electron Device Letters, vol. EDL-8, No. 9, 1987, pp. 407–409.
*The Merged P-I-N Schottky (MPS) Rectifier: A High-Voltage, High-Speed Power Diode,* B. J. Baliga et al.; Proceedings of the IEDM—International Electron Devices Meeting, Washington, D.C., Dec. 1987, pp. 658–661.

*Primary Examiner*—William Mintel
*Attorney, Agent, or Firm*—Bell, Seltzer, Park & Gibson

[57] ABSTRACT

A merged P-I-N/Schottky power rectifier includes trenches, and P-N junctions along the walls of the trenches and along the bottoms of the trenches. By forming the P-N junctions along the trench walls, the total area of the P-N junctions relative to the surface area of the device can be increased, to thereby improve the device's on-state characteristics without sacrificing the total area of the Schottky region. The trenches may be U or V shaped in transverse cross-section or of other transverse cross-sectional shape, and the trenches may be polygonal or circular in top view.

16 Claims, 11 Drawing Sheets

MERGED P-I-N/SCHOTTKY POWER RECTIFIER HAVING EXTENDED P-I-N JUNCTION

FIELD OF THE INVENTION

This invention relates to power rectifiers and more particularly to merged P-I-N/Schottky power rectifiers.

BACKGROUND OF THE INVENTION

Power devices are widely used to carry large currents at high voltages. One important power device is the power rectifier. As is well known to those having skill in the art, a rectifier allows current flow freely in one direction and blocks current flow in the other direction.

Modern power systems tend to operate at increasingly higher frequencies. High frequency operation allows smaller size components to be used in a power system and allows more efficient system design. Accordingly, modern high frequency power circuits require power rectifiers with fast switching characteristics.

The P-I-N rectifier was one of the first semiconductor devices developed for power applications. In a P-I-N rectifier, an intrinsic ("I") semiconductor layer is formed between P- and N-type semiconductor layers. The intrinsic region need not be truly intrinsic as long as its resistivity is relatively high compared to the N-type region. The P-I-N rectifier is typically formed by growing a lightly doped N-type region on a heavily doped N+ region, resulting in an N+N−P+ structure. The intrinsic region is also referred to as the "drift" region.

In operation, the intrinsic region is flooded with minority carriers during forward conduction. The resistance of the intrinsic region becomes very small during current flow, allowing the rectifier to carry high current densities during forward conduction.

The P-I-N rectifier has been the dominant rectifier for high-voltage power systems, where the device must withstand over 100 volts in the reverse direction. Unfortunately, two important drawbacks of the P-I-N rectifier limit its applicability. First, when a P-I-N rectifier is turned on at high speed, its forward voltage drop has been found to initially exceed its voltage drop during steady state current conduction. This phenomena is called "forward voltage overshoot during the turn on transient", and results from the existence of the highly resistive intrinsic region. A high forward overshoot voltage in the P-I-N rectifier can be a serious problem in power circuits because this voltage may appear across the emitter-base junction of a bipolar transistor used in the circuit, and may exceed the transistor's breakdown voltage.

A second and more serious drawback of the P-I-N rectifier is its poor reverse recovery characteristics. Reverse recovery is the process by which the rectifier is switched from its "on" or forward conduction state to its "off" or reverse blocking state. To undergo this transition, the minority carrier charge stored in the intrinsic region during forward conduction must be removed. Removal of the stored charge during switching produces a large peak reverse recovery current, and results in long reverse recovery time. The large peak reverse current of the P-I-N rectifier can cause power loss and stress in the circuit, and the long reverse recovery time limits the operating frequency of the power system. The switching characteristics of the P-I-N rectifier have been improved by lifetime control techniques, such as by the introduction of recombination centers in the intrinsic region. However, the reduction in lifetime results in a higher forward voltage drop and a larger reverse leakage current. A detailed discussion of the theory and operation of P-I-N rectifiers may be found in section 8.1 of the textbook entitled *Modern Power Devices* by coinventor B. Jayant Baliga, published by John Wiley & Sons, Inc., 1987, the disclosure of which is hereby incorporated herein by reference.

Schottky barrier rectifiers have also been used in power circuits. As is known to those having skill in the art, a Schottky rectifier produces rectification as a result of nonlinear current transport across a metal-semiconductor contact. The potential barrier responsible for this behavior was ascribed to the presence of a stable space-charge layer by Schottky in 1938. In a Schottky power rectifier, the dominant current flow is by thermionic emission. Reverse blocking takes place by introducing a depletion layer into the semiconductor. The optimization of the characteristics of the Schottky power rectifier requires a tradeoff between forward voltage drop and reverse leakage current. As the Schottky barrier height is reduced, the forward voltage drop decreases, but the leakage current increases and the maximum operating temperature decreases. The ultimate limiting factor which determines the choice of the Schottky barrier height is typically the power dissipation required in the rectifier.

Since forward current transport in the Schottky rectifier occurs primarily through majority carriers, these devices exhibit an extremely fast reverse recovery behavior. Furthermore, there is typically no forward overvoltage transient as experienced with P-I-N rectifiers. A detailed discussion of the theory and operation of Schottky barrier rectifiers may be found in Section 8.2 of the above cited textbook by coinventor Baliga, the disclosure of which is hereby incorporated herein by reference.

In order to obtain the desirable characteristics of the P-I-N rectifier and the Schottky rectifier while limiting the drawbacks of both, it has been proposed to merge a Schottky rectifier with a P-I-N rectifier. The Merged P-I-N/Schottky rectifier (also referred to as an "MPS rectifier"), merges a Schottky contact region with a planar P+N junction region. The MPS rectifier is described in an article by coinventor Baliga entitled *Analysis of a High Voltage Merged P-I-N/Schottky (MPS) Rectifier*, IEEE Electron Device Letters, Vol. EDL-8, pp. 407–409, 1987; in an article by coinventor Baliga and Chang entitled *The Merged P-I-N/Schottky (MPS) Rectifier: A High-Voltage, High-Speed Diode*, Proceedings of the IEDM, pp. 651–661, 1987; and in an article by the present inventors entitled *Optimization of the MPS Rectifier Via Variation of Schottky Region Area*, Proceedings of the Third International Symposium on Power Semiconductor Devices and IC's, pp. 109–112, April 1991. The disclosure of all three articles is hereby incorporated herein by reference. FIG. 1 herein is a reproduction of FIG. 1 of the last mentioned article, and illustrates the unit cell structure for a merged P-I-N Schottky rectifier.

In the merged P-I-N/Schottky rectifier, the P-I-N region injects minority carriers, to thereby reduce the series resistance in the drift region. As a consequence, the forward voltage drop for the MPS rectifier remains low, even at high current density. The Schottky region also reduces the stored charge in the drift region and results in high switching speeds.

Unfortunately, the MPS rectifier exhibits a high voltage drop at large current densities, due to the smaller area P+N junction compared to a pure P-I-N rectifier. Also, the leakage current in the MPS rectifier, when fabricated using planar diffusion to form the P+N junction, increases with increasing reverse bias voltage. This increase in leakage current may become substantial when the Schottky region increases and the planar P+N junction no longer provides enough pinch-off effect to suppress the leakage current through the Schottky interface. The on-state and reverse blocking characteristics of the MPS rectifier can be improved by increasing the P+N junction area in the device. Unfortunately, an increase in P+N junction area results in degradation of the switching performance of the MPS rectifier, due to the resultant reduction in Schottky area.

One attempt to improve the operation of the MPS rectifier is described in U.S. Pat. No. 4,982,260 to Chang, coinventor Baliga and Tung, entitled *Power Rectifier with Trenches*, the disclosure of which is hereby incorporated herein by reference. The required forward bias voltage is reduced by providing a plurality of trenches between the P-I-N regions of the device. A Schottky contact is formed at the bottom of each trench. Alternatively, as shown in FIG. 14B, reproduced herein as FIG. 2, P+ regions may be formed at the bottom of each trench and a Schottky contact may be formed on the substrate face between the trenches. Unfortunately, these structures may suffer from the same poor leakage current and on-state characteristics associated with the conventional MPS rectifier without trenches.

SUMMARY OF THE INVENTION

It is therefore an object of the invention to provide an improved merged P-I-N/Schottky (MPS) power rectifier.

It is another object of the invention to provide an improved merged P-I-N/Schottky (MPS) power rectifier including trenches.

It is yet another object of the present invention to provide a merged P-I-N/Schottky (MPS) power rectifier including trenches, in which the area of the P-N junction in the device can be increased to thereby improve the on-state and reverse blocking characteristics, without significantly degrading the switching performance of the MPS rectifier.

These and other objects are provided, according to the present invention, by a merged P-I-N/Schottky (MPS) rectifier including trenches, in which P+N junctions are formed along the walls of the trenches, in addition to the bottoms of the trenches. By forming P+N junctions along the trench walls, the total area of the P+N junctions relative to the surface area of the device can be increased, to thereby improve the on-state characteristics. The increase in P-N junction area can be accomplished without sacrificing the total area of the Schottky region. Moreover, by providing a P+N junction along the trench walls in addition to the trench bottoms, the leakage current is reduced due to the superior pinch-off effect at the Schottky interface.

In particular, according to the invention, a semiconductor rectifier includes a semiconductor substrate of first conductivity type having first and second opposing faces. A plurality of spaced apart trenches are formed in the semiconductor substrate at the first face, with each of the trenches having a trench bottom and a trench wall. The semiconductor substrate is doped a second conductivity type adjacent the trench walls and adjacent the trench bottoms to form an extended area P-N junction. Preferably, the entire surface of the trench walls and trench bottoms is doped the second conductivity type, to form a continuous doped region in the trench. A metal layer is formed on the first face of the substrate, on the trench walls and on the trench bottoms. The metal layer forms an ohmic contact at the trench walls and the trench bottoms and forms a Schottky contact at the first face of the substrate between the trenches. An ohmic contact is also formed on the second face of the substrate.

Accordingly, the P+N junction area is increased by forming the second conductivity type region adjacent the trench walls and adjacent the trench bottoms, without sacrificing the total area of the Schottky region. As a result, the forward conduction characteristics of the device are improved because more minority carriers are injected to provide conductivity modulation of the drift layer. The switching characteristics of the device are also improved, due to the preservation of large Schottky contact regions. During the reverse blocking mode, the deeper trench P+N junction region provides a strong pinch-off effect at the Schottky interface. A smaller leakage current is therefore produced by the rectifier of the present invention, compared to the conventional MPS rectifier.

According to the present invention, P+N junctions are formed on the trench walls in addition to the trench bottoms. It will be understood by those having skill in the art that the trenches may be U-shaped in transverse cross-section, V-shaped in transverse cross-section, or other transverse cross-sectional shapes. The trenches may include flat, curved or pointed bottoms and straight or curved walls, which are orthogonal or oblique to the first face of the substrate. Moreover, the trenches may be linear, polygonal or circular in top view. It will also be understood by those having skill in the art that the semiconductor substrate typically comprises a relatively heavily doped portion of first conductivity type adjacent the second face and a relatively lightly doped portion (the intrinsic region or drift region) of the first conductivity type adjacent the first face.

DETAILED DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
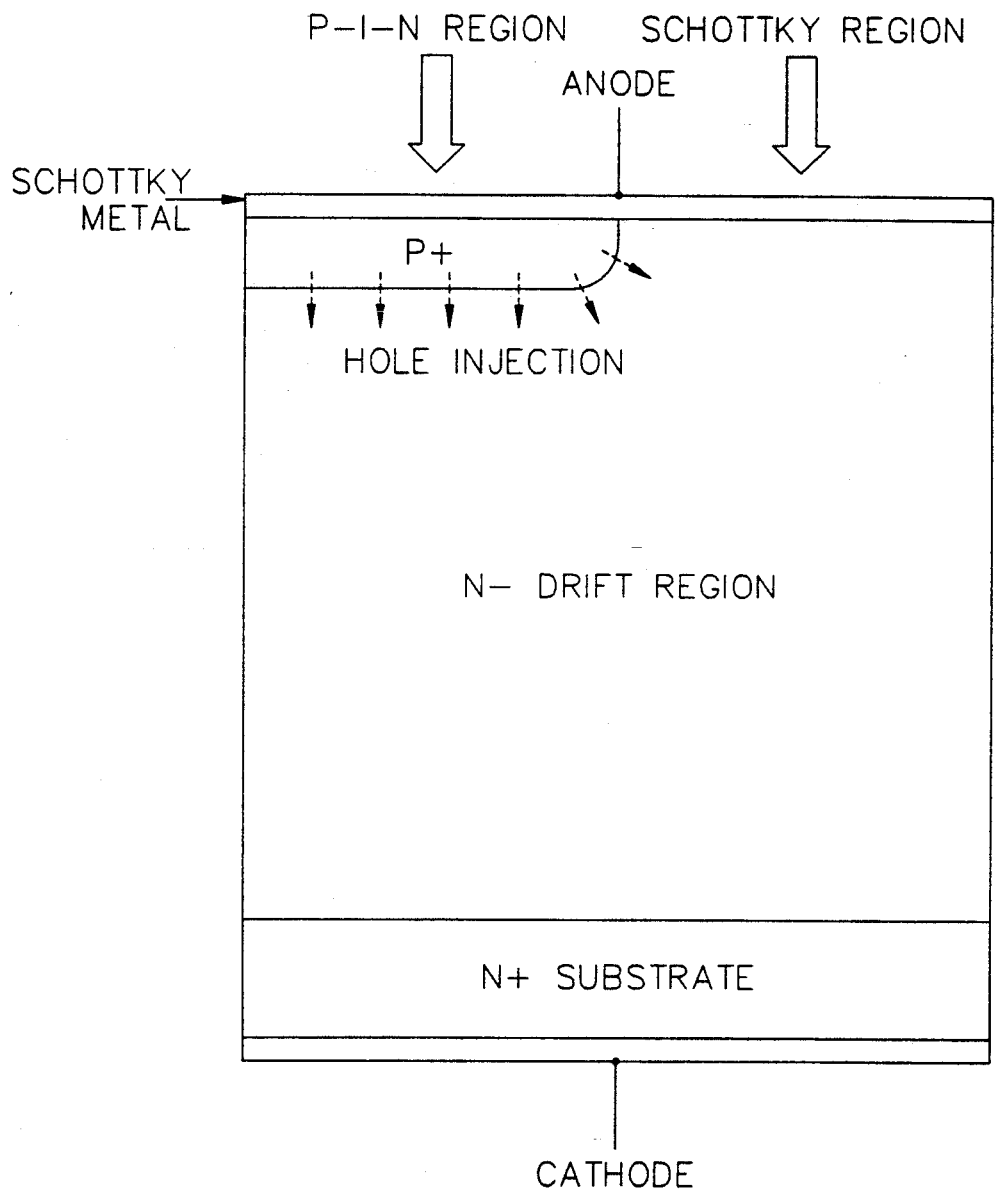
FIG. 1 illustrates a cross-sectional view of a known Merged P-I-N/Schottky rectifier.
Figure 2:
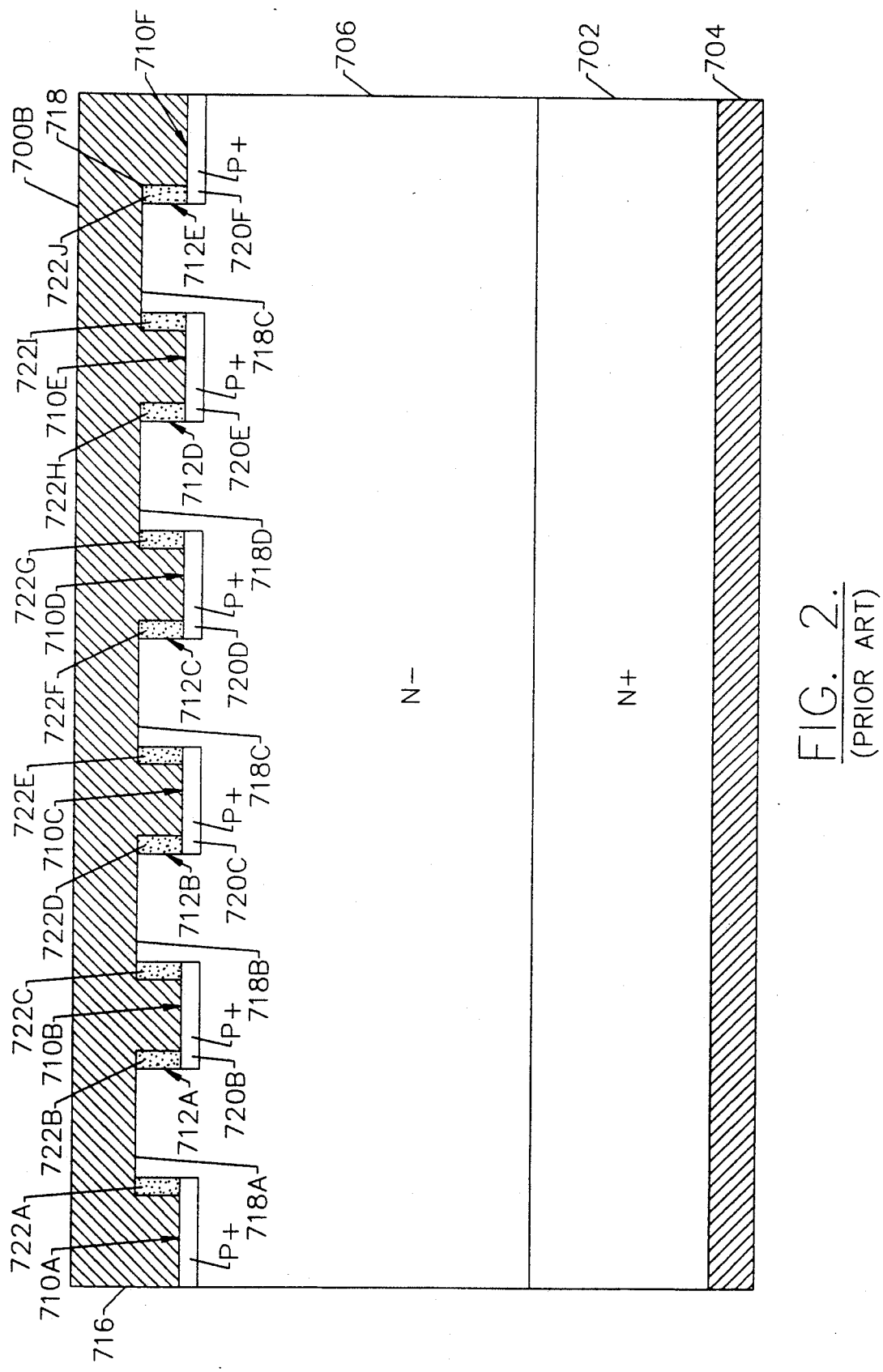
FIG. 2 illustrates another known Merged P-I-N/Schottky rectifier.
Figure 3:
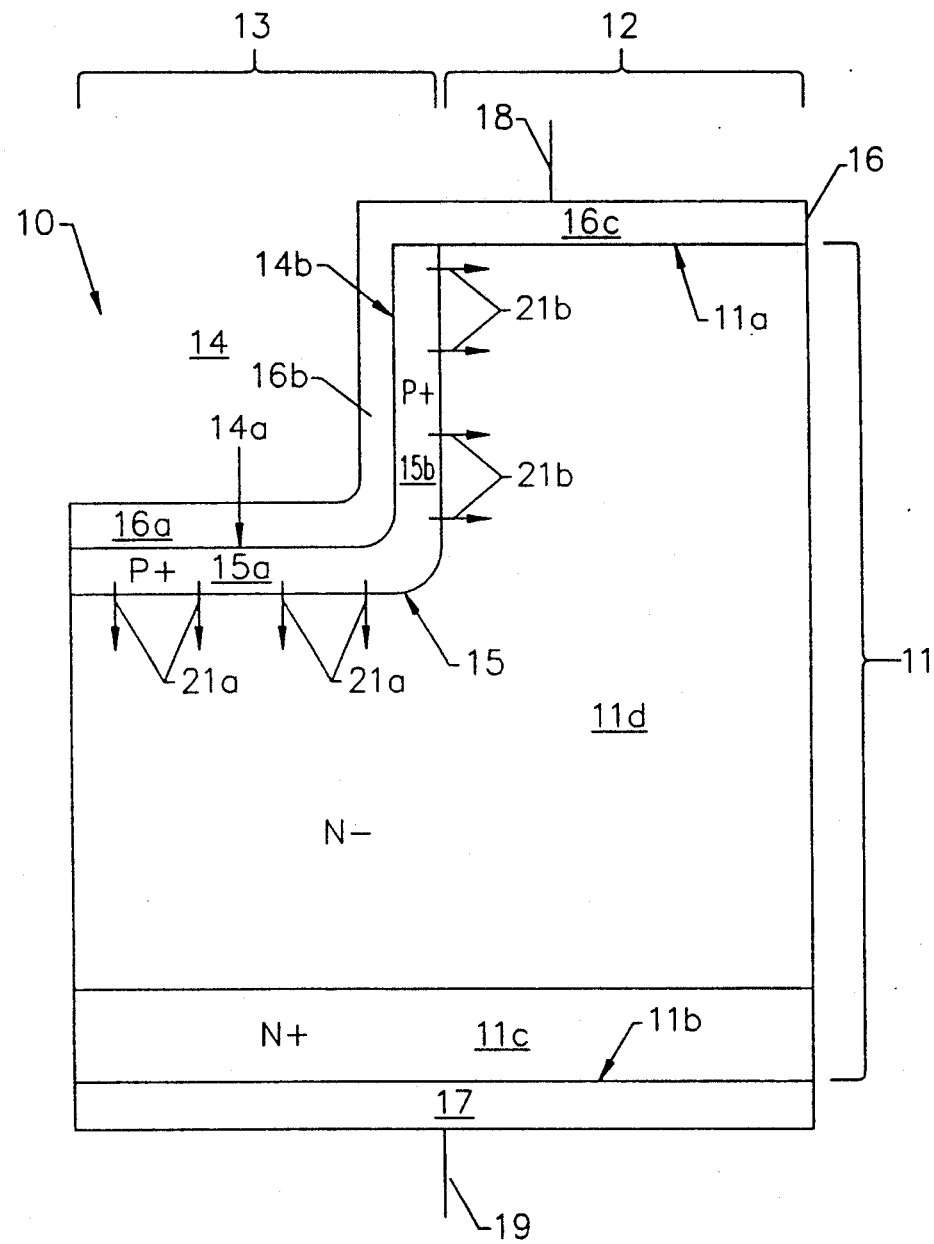
FIG. 3 is a cross-sectional representation of a unit cell of a semiconductor rectifier according to the present invention.

Referring now to FIG. 3, a cross-sectional representation of a unit cell 10 of a semiconductor rectifier according to the present invention is shown. The unit cell 10 includes a semiconductor substrate 11, typically silicon, of first conductivity type, typically N-type conductivity, having a first face 11a and a second opposing face 11b. Portion 11c, adjacent the second face 11b, is typically relatively heavily doped, shown by N+ in FIG. 3. Portion 11d, adjacent first face 11a, is typically relatively lightly doped, as shown by N− in FIG. 3. Portion 11d is also referred to as the "intrinsic" region or the "drift" region.

As shown in FIG. 3, the semiconductor rectifier includes two main regions: Schottky barrier diode region 12 and P-I-N region 13. In Schottky barrier diode region 12, a Schottky barrier is formed by portion 16c of metal layer 16 on first face 11a of substrate 11. An ohmic contact layer 17 on the second face 11b of substrate 11 is also provided.

P-I-N diode region 13 is formed by P+ region 15, N-drift region 11d and N+ region 11c. Portions 16a and 16b of metal layer 16 form an ohmic contact to p+ region 15, and metal layer 17 forms an ohmic contact to N+ region 11c. An anode electrode 18 and cathode electrode 19 complete the device.

According to the invention, p+ region 15 is formed in a trench 14 in the first face 11a of substrate 11. As shown, trench 14 includes a trench bottom 14a and a trench wall 14b. According to the invention, region 15 of second conductivity is comprised of two portions: a portion 15a adjacent trench bottom 14a and a portion 15b adjacent trench wall 14b. Preferably, portion 15b extends over the entire trench wall 14b from first face 11a to trench bottom 14b. Portions 16a and 16b of metal layer 16, are formed on trench bottom 14a and trench wall 14b respectively, to produce an ohmic contact to P+ regions 15a and 15b respectively. It will be understood by those having skill in the art that a complementary device to that shown in FIG. 3 may also be formed. Moreover, the device may be formed in semiconductors other than silicon.

Operation of the device of FIG. 3 will now be described. As in the case of the planar merged P-I-N/Schottky rectifier, rectifier 10 acts like a Schottky barrier rectifier at low forward bias voltages, such as less than about 0.7 volts. When the forward bias voltage reaches about 0.7 volts, a significant amount of minority carriers 21a, 21b (holes in this device) are injected from the P+N junction formed by regions 15 and 11d, into the drift region 11d. As a result, the resistance of the drift region 11d is greatly reduced by conductivity modulation at large forward bias voltages. Both the p-I-N region 13 and the Schottky barrier diode region 12 contribute to forward current conduction.

With a further increase in forward bias, the amount of current flowing in the P-I-N region 13 becomes dominant. However, the device 10 has an advantage over known Merged P-I-N/Schottky (MPS) rectifiers in terms of current conducting area. In known MPS rectifiers, the area of the P-N junction is always a fraction of the total surface area. At high current densities, this results in a higher forward voltage drop for the known MPS rectifier than that observed in the P-I-N rectifier. This is because the current conduction is dominated by the P-I-N current at high current densities. For devices having the same active area, the MPS rectifier has a smaller P+N junction area available for the injection of holes compared with a pure P-I-N rectifier. This problem is also present in FIG. 14B of U.S. Pat. No. 4,892,260 to Chang et al., where the P-I-N regions are only formed at the bottom of the trenches.

According to the present invention, this problem is overcome by extending P+ region 15b along the wall 14b of trench 14 in addition to the bottom 14a of the trench. For a given trench width, the area of the P-N junctions can be extended by increasing the depth of the trenches in the substrate. This can be done without incurring any reduction in the area of the Schottky barrier contact. The forward characteristics of the device 10 at high current densities is thus improved, because hole injection takes place at the wall of the trench as shown by arrows 21b, in addition to the bottom of the trench as shown by arrows 21a. An extended P-N junction area is available for providing hole injection. At the same time, majority carrier conduction through the Schottky region 12 is retained, because the area of Schottky contact region can be preserved when the P-I-N junction area is increased by increasing the trench depth.

Figure 4:
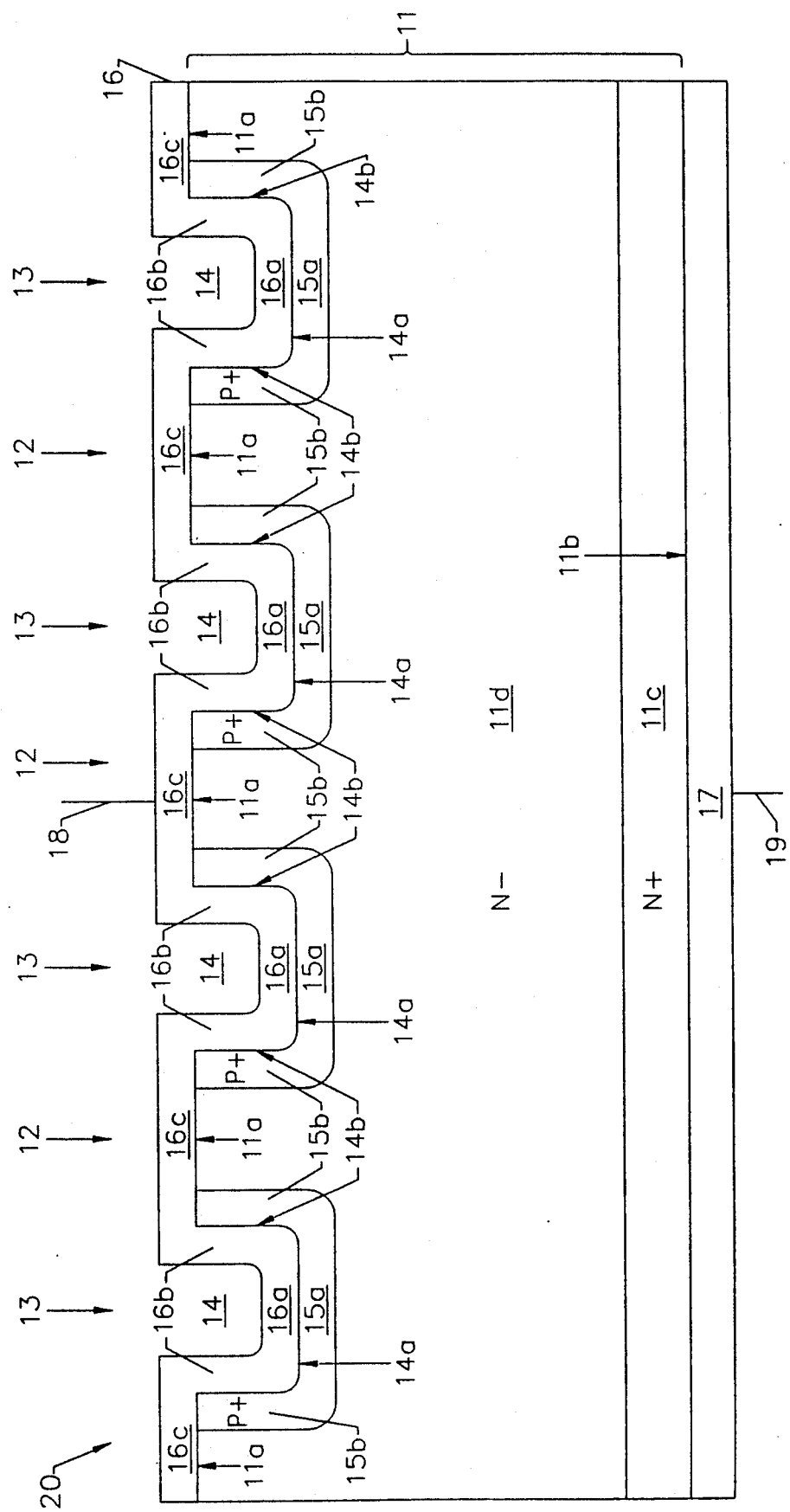
FIG. 4 is a cross-sectional representation of a rectifier according to the present invention.

Referring now to FIG. 4, an embodiment of a merged P-I-N/Schottky power rectifier with an extended P-N junction according to the invention is shown. As shown, rectifier 20 includes a plurality of unit cells already described in connection with FIG. 3. Typical devices may include an array of about 100 or more unit cells. As shown in FIG. 4, the corners of the trenches are preferably rounded, at the intersection of the trench bottoms 14a and trench walls 14b, to prevent field-crowding.

Figure 5A:
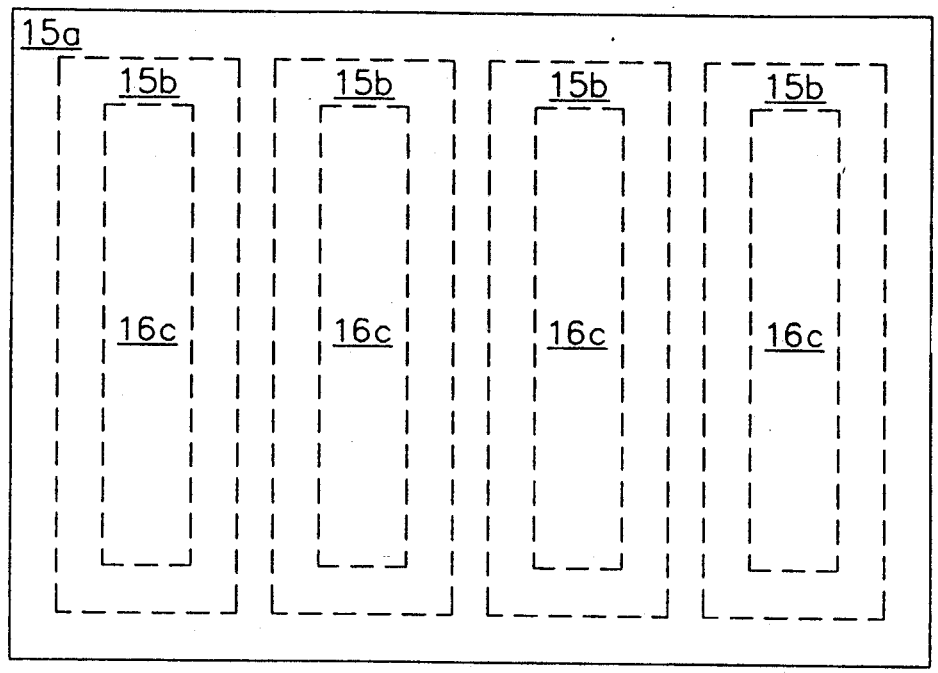
FIGS. 5A-5C illustrate alternate top views of the structure of FIG. 4.
Figure 5B:
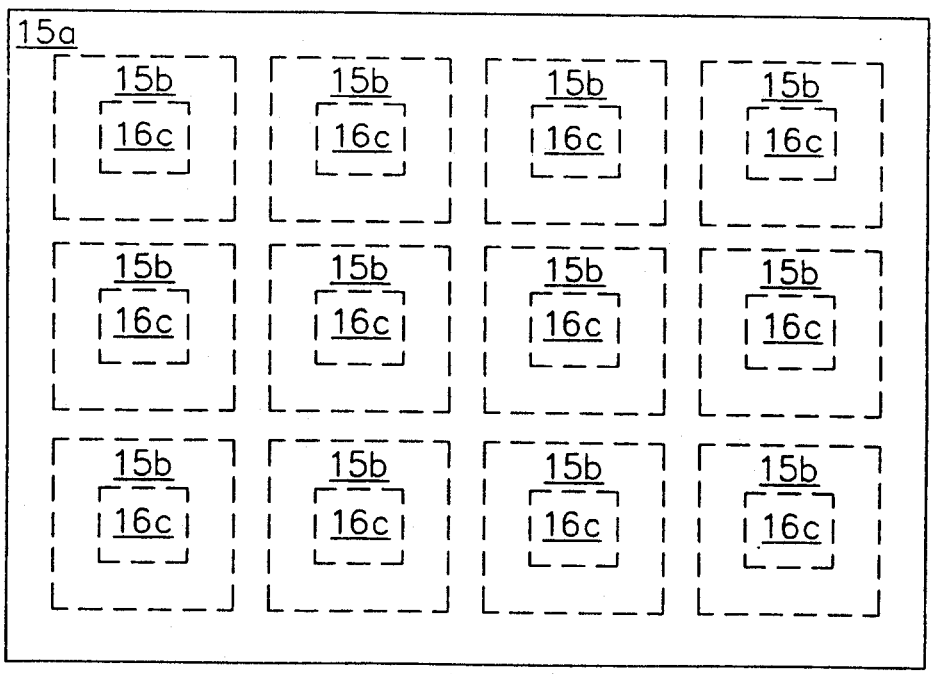
Figure 5C:
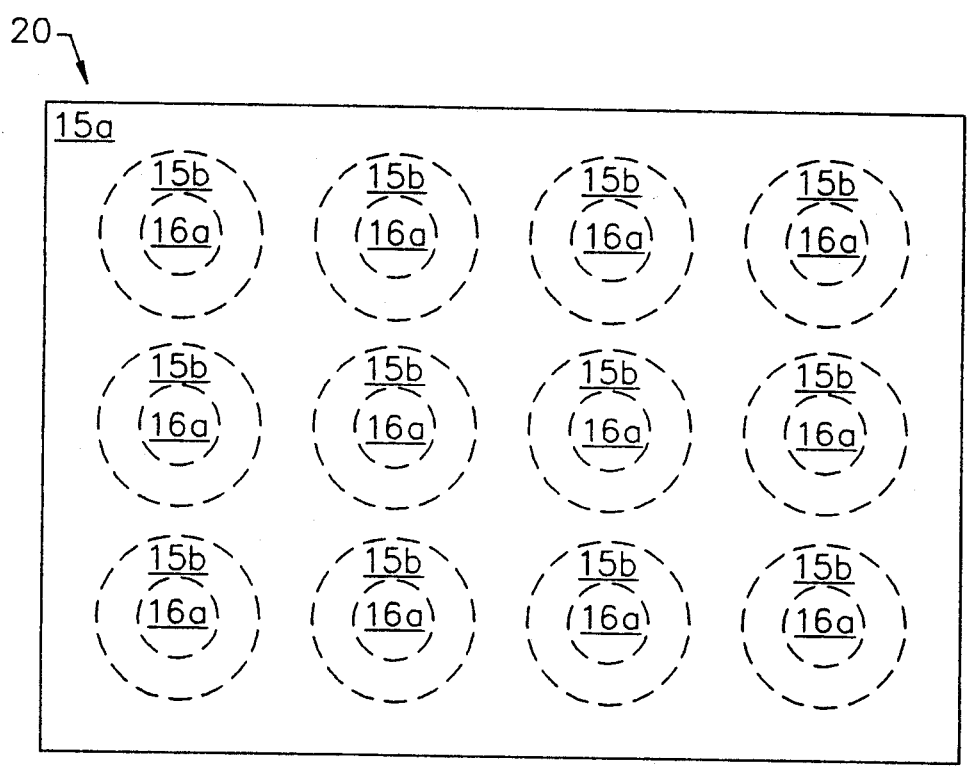

FIGS. 5A-5C illustrate alternate top views of the structure of FIG. 4 and illustrate the P+ region beneath metal layer 16. Regions 15a on the trench bottoms are shown, and the extended junctions 15b on the trench walls are also shown. As shown, the trenches and regions 15a, 15b may be elongated (FIG. 5A), square (FIG. 5B), or any other polygonal shape, or circular (FIG. 5C).

Figure 6A:
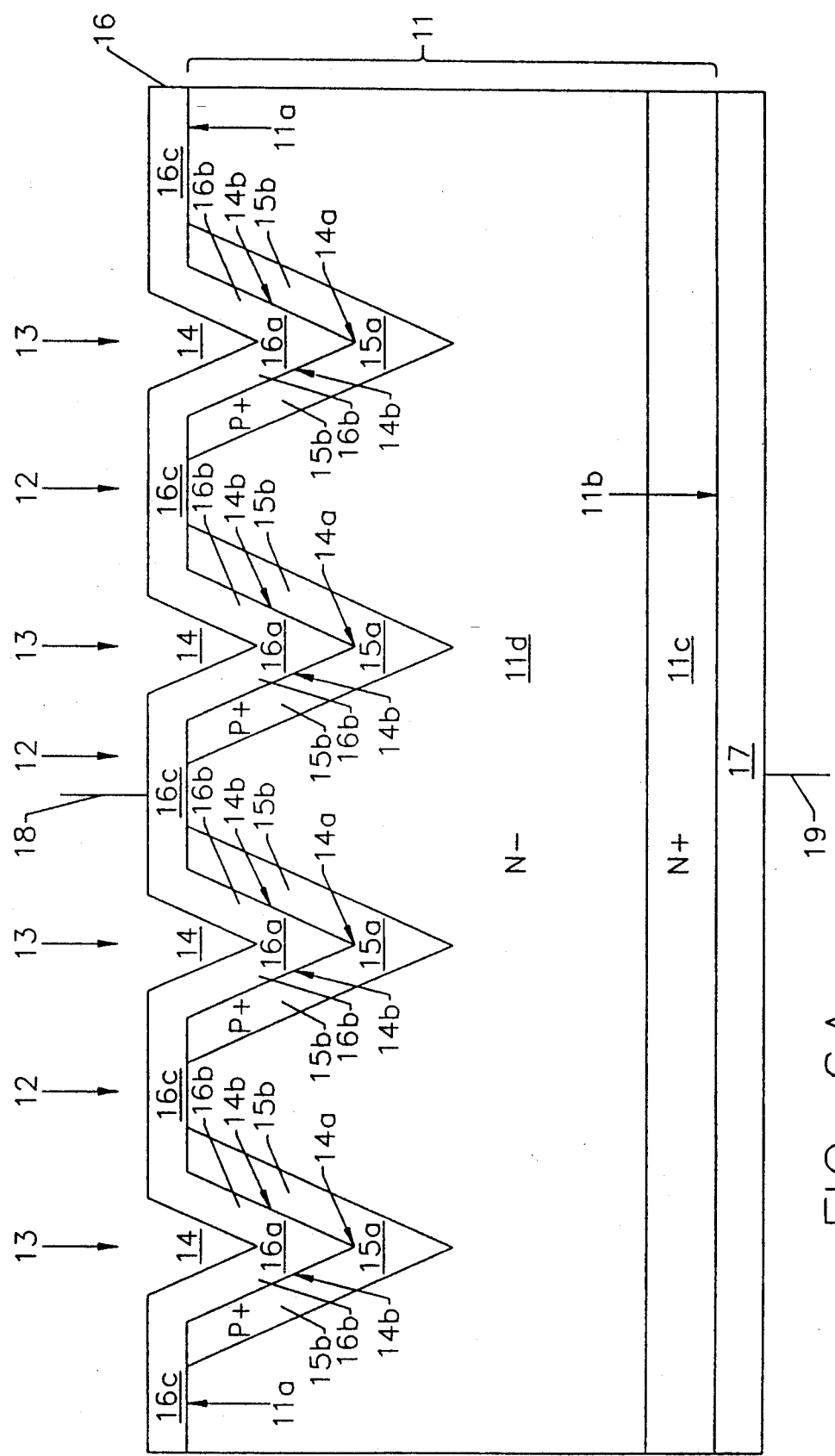
FIGS. 6A and 6B illustrate cross-sectional views of alternate embodiments of the structure of FIG. 4.
Figure 6B:
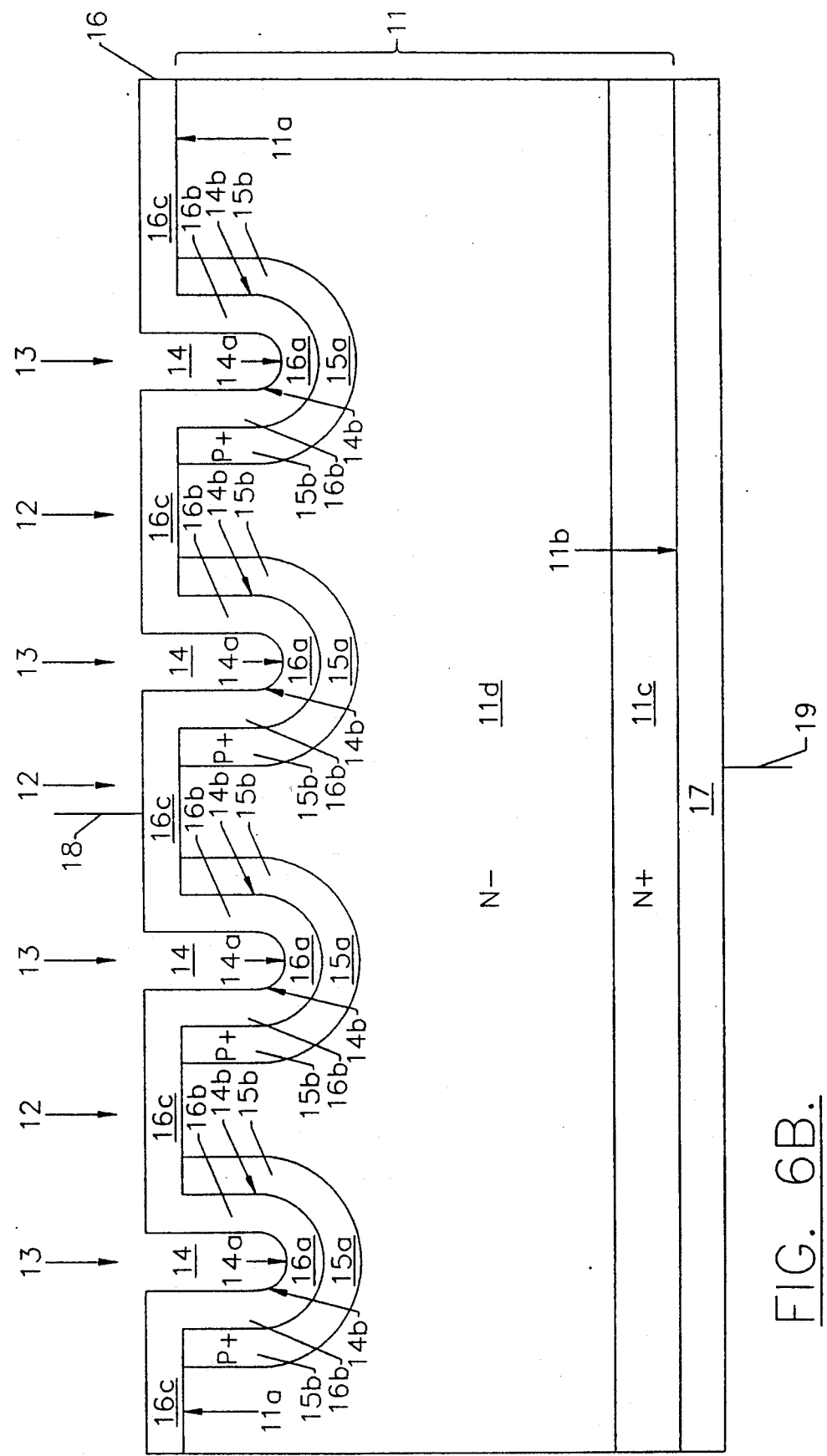

FIGS. 6A and 6B illustrate transverse cross-sectional views of alternate embodiments of the structure of FIG. 4. In FIG. 6A, the trenches are V-shaped in transverse cross-section, with pointed trench bottoms 14a and oblique trench walls 14b. In FIG. 6B, the trenches are U-shaped in transverse cross-section, with curved bottoms 14a, and trench walls 14b which are orthogonal to the first face 11a. Other transverse cross-sections may be used. As presently contemplated by the inventors, the transverse cross-section illustrated in FIG. 6B is preferred because it results in the highest breakdown voltage due to reduced electric fields at the bottom of the trenches.

Figure 7A:
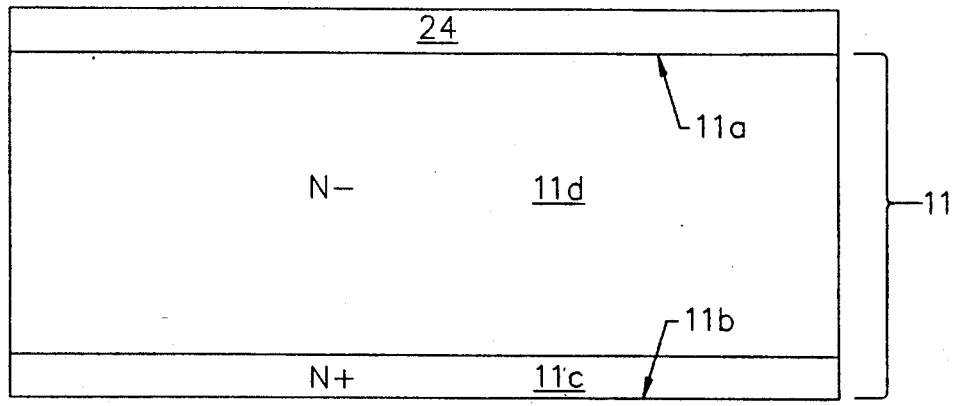
FIGS. 7A-7F are cross-sectional views of the structure of FIG. 4 during intermediate fabrication steps.
Figure 7B:
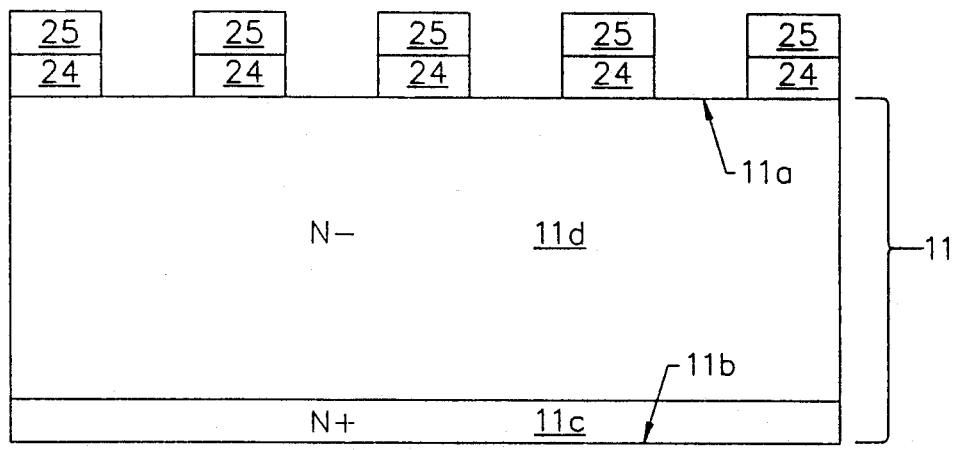

Referring to FIGS. 7A-7F, a process for fabricating device 20 of FIG. 4 will now be described. Referring to FIG. 7A, substrate 11 is first formed by epitaxially growing layer 11d on layer 11c. Layer 11c is preferably an 0.002Ω-cm N-type silicon wafer doped at about $10^{19}$ dopants-$cm^{-3}$. Epitaxial layer 1id is preferably a 25Ω-cm <111>, epitaxial silicon layer about 90 μm thick. A field oxide layer 24, about 1 μm thick, is grown on face 11a Then, referring to FIG. 7B, photoresist 25 is applied to face 11a, and exposed to pattern the photoresist. A conventional buffered oxide etch is then performed to pattern the oxide layer 24 as shown in FIG. 7B. Other patterning techniques may also be used.

Figure 7C:
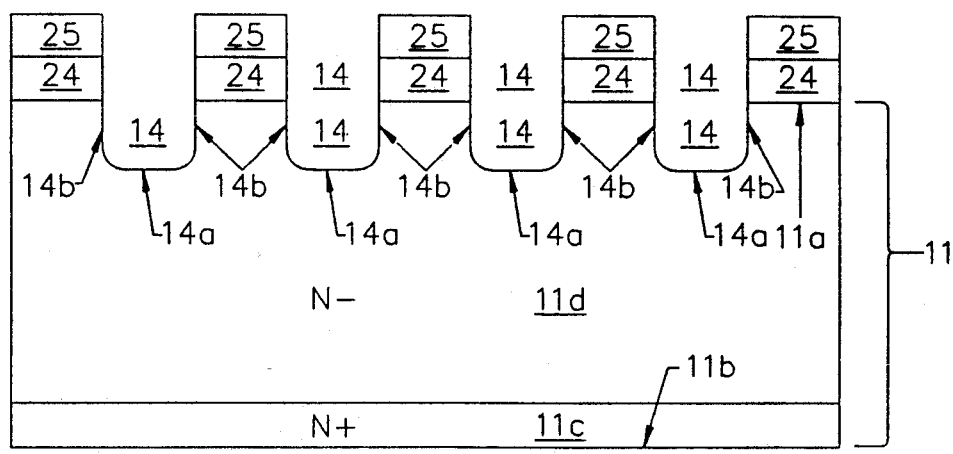

Then, referring to FIG. 7C, trenches 14 are etched into layer 11d at face 11a through oxide mask 24. Deep trenches may be achieved by reactive ion etching (RIE) in a process similar to that described in a publication entitled *Reactive Ion Etching of Silicon Trenches Using $SF_6/O_2$ Gas Mixtures* by Syau, coinventor Baliga and Hamaker, Journal of the Electrochemical Society, Vol. 138, No. 10, pp. 3076–3081, October 1991, the disclosure of which is hereby incorporated herein by reference. The RIE system may be a SEMI GROUP Model 1000TP system, which consists of two parallel plate electrodes separated by a distance of 4.5 cm. Radio frequency power at a density of about 0.15 w/$cm^2$ may be applied to the bottom electrode which holds the wafers. The RIE plasma source may be a 75% $SF_6$ and 25% $O_2$ gas mixture. Etching times of twenty, thirty, forty and fifty minutes result in trench depths of 5 μm, 8 μm, 10 μm and 12 μm, respectively.

After reactive ion etching, the photoresist 25 is removed and the wafers are cleaned using a standard cleaning process. A 1000Å dry oxidation is then performed (not shown), followed by buffered oxide etching to remove the oxide, followed by another cleaning. This sacrificial oxidation is performed to remove trench surface damage which takes place during reactive ion etching, as described in the above Syau et al. publication.

Figure 7D:
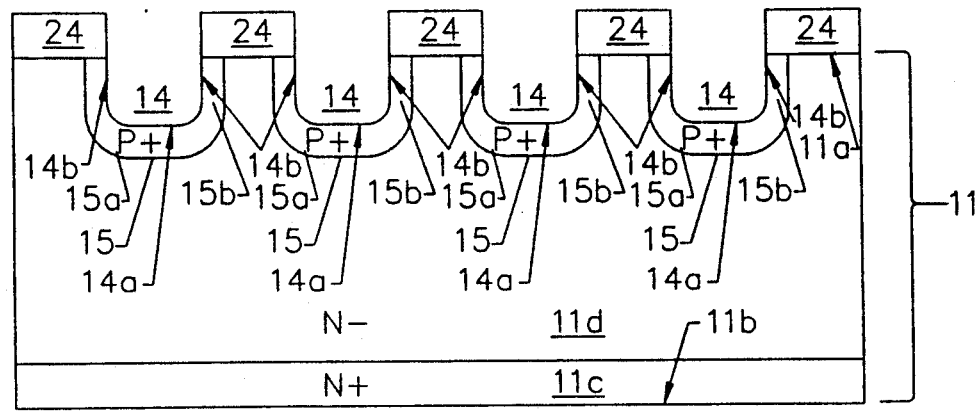
Figure 7E:
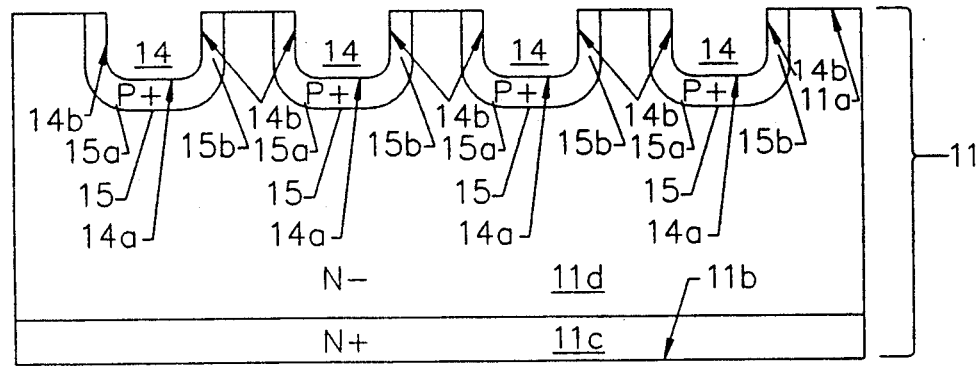

Referring now to FIG. 7D, a P+ diffusion of boron is performed using boron nitride wafers as the dopant source, to form P+ region 15a on the bottoms 14a of the trenches and P+ region 15b on the walls 14b of the trenches. Since P+ layers must be formed in the trench walls, ion implantation is typically not suited for this process. Accordingly, a solid boron nitride source diffusion system is used. Solid source of diffusion is described in the textbook by Ghandi entitled *The Theory and Practice of Microelectronics*, at pages 91–95. Diffusion at 925° C. for 50 minutes results in a P+ region thickness of about 0.9 μm. After diffusion, field oxide 24 is removed, as shown in FIG. 7E.

Figure 7F:
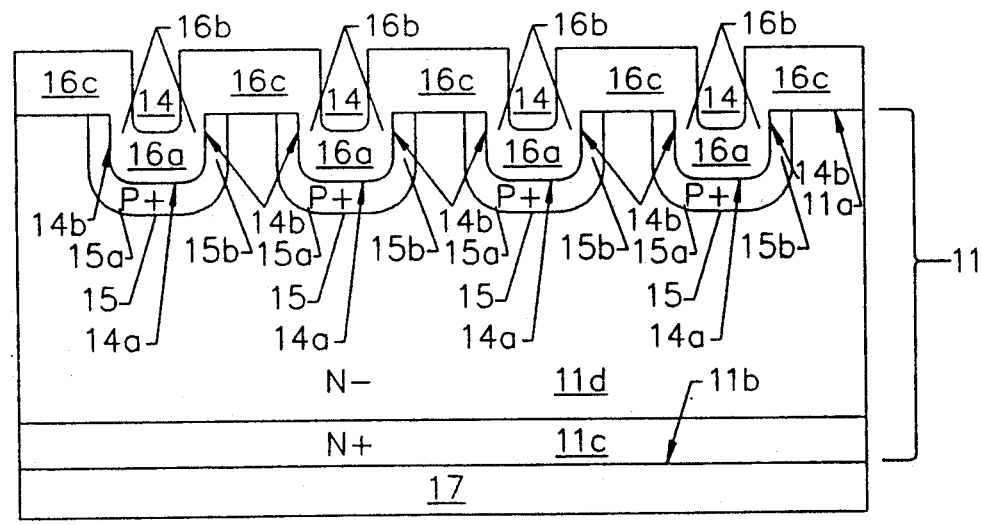

Referring now to FIG. 7F, layer 16 is conformally deposited using sputter deposition or other known processes. As already described, portion 16c forms a Schottky barrier with the drift region 11d, While portions 16b and 16a form an ohmic contact to P+ regions 15a and 15b respectively. Layer 16 may be 4 μm thick, and is preferably aluminum. It will also be understood that other metals may be used to form Schottky contact 16c and ohmic contacts 16a–16b. For example, chromium or titanium may be used. Aluminum may also be used to form ohmic contact 17 and the structure may then be annealed. External anode and cathode electrodes 18 and 19 respectively are then attached to produce the structure of FIG. 4.

Electrical measurements have been performed on fabricated rectifiers according to the present invention, as well as planar merged P-I-N/Schottky rectifiers and P-I-N rectifiers. All of the devices had an active area of 0.0062 $cm^2$ and an aluminum Schottky contact barrier of 0.8 eV. The conventional MPS rectifier and the MPS rectifier of the present invention (referred to as a "TRENCH MPS" in FIG. 8) each have the same trench window size (26 μm) and pitch (46 μm). Two trench depths d were compared. The results of these measurements are shown in FIG. 8.

Figure 8:
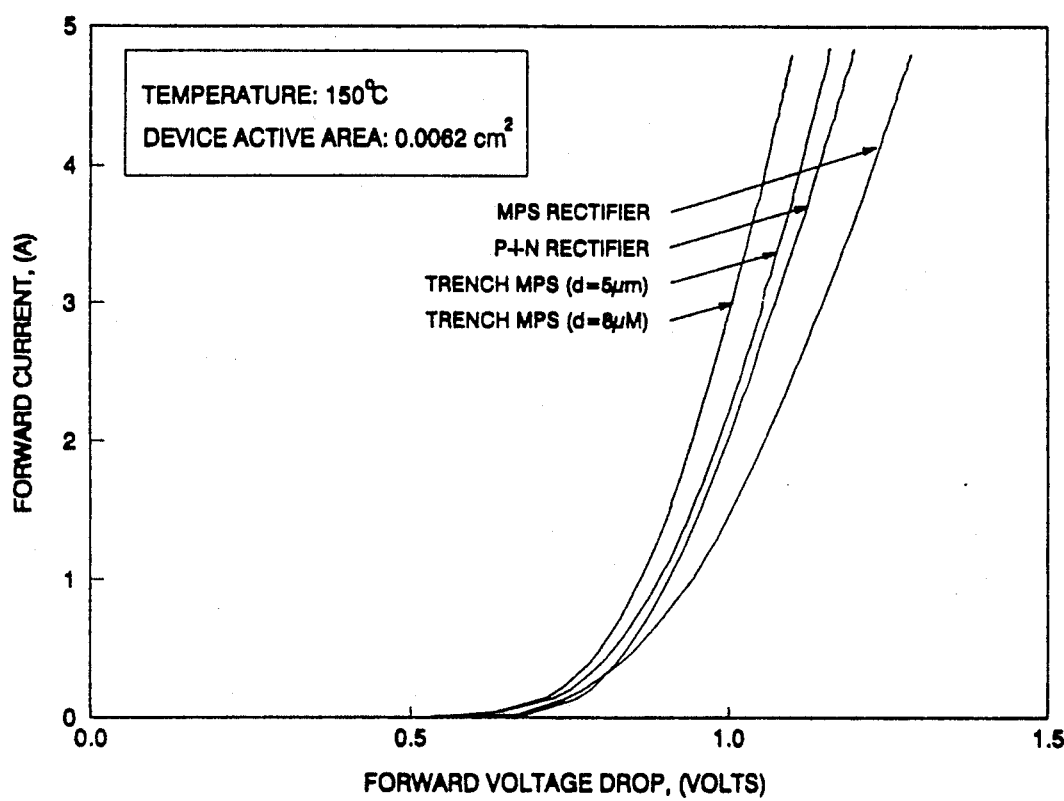
FIG. 8 is a graphical illustration of the performance of a rectifier of the present invention, compared to known rectifiers.

As shown in FIG. 8, the forward voltage drop is significantly reduced for a given forward current. It can be seen that the rectifiers of the present invention operate at a current level higher than that of the P-I-N rectifier and the conventional MPS rectifier. The P-I-N rectifier has long been recognized for providing very low forward drop at large current densities. However, it has now been shown that the rectifier of the present invention provides significantly lower forward voltage drop. As already described, for the conventional planar MPS rectifier, the forward voltage drop depends on the area of the Schottky and P-I-N regions as well as the on-state current level. In a planar MPS rectifier, the percentages of the P-I-N area and the Schottky area are complimentary to each other. However, in a rectifier of the present invention, the area of the P-I-N region also depends on the trench depth. For a given Schottky area percentage, rectifiers of the present invention with different trench depths can have extended P-I-N area which leads to superior on-state characteristics.

In conclusion, a rectifier of the present invention can provide improved forward conduction characteristics and an improved tradeoff curve between on-state and switching characteristics. Accordingly, a rectifier of the present invention provides an improved rectifier for high-frequency, low-loss power circuit applications, where fast switching speed and low forward drop are desirable.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A semiconductor rectifier comprising:
   a semiconductor substrate of first conductivity type having first and second opposing faces;
   a plurality of spaced apart trenches in said semiconductor substrate at said first face, each having a trench bottom and a trench wall;
   said semiconductor substrate being doped a second conductivity type adjacent said trench walls and adjacent said trench bottoms;
   a metal layer on said first face between said trenches, on said trench walls and on said trench bottoms, said metal layer and said second conductivity type doping forming an ohmic contact at said trench walls and at said trench bottoms, said metal layer and said semiconductor substrate of first conductivity type forming a Schottky contact at said first face between said trenches; and
   an ohmic contact on said second face.

2. The semiconductor rectifier of first portion of said first conductivity type adjacent said second face, and a second portion of said first conductivity type adjacent said first face, wherein said first portion is more heavily doped than said second portion.

3. The semiconductor rectifier of claim 1 wherein said trenches are U-shaped in transverse cross-section, and comprise a planar trench bottom extending parallel to said first face and a trench wall extending orthogonal to said first face.

4. The semiconductor rectifier of claim 3 wherein said trenches are rounded at intersections of said trench bottoms and said trench walls.

5. The semiconductor rectifier of claim 1 wherein said trenches are U-shaped in transverse cross-section, and comprise a nonplanar trench bottom and a trench wall extending orthogonal to said first face.

6. The semiconductor rectifier of claim 1 wherein said trenches are V-shaped in transverse cross-section, and comprise a pointed trench bottom and an oblique trench wall.

7. The semiconductor rectifier of claim 1 wherein said first conductivity type is N-type and wherein said second conductivity type is P-type.

8. The semiconductor of rectifier of claim 1 wherein said semiconductor substrate is doped said second conductivity type adjacent the entire trench wall, from said first face to said trench bottom.

9. The semiconductor rectifier of claim 1 wherein said metal layer is an aluminum layer.

10. A semiconductor rectifier comprising:
   a semiconductor substrate of first conductivity type having first and second opposing faces;
   a plurality of spaced apart trenches in said semiconductor substrate at said first face, each having a trench bottom and a trench wall extending orthogonal to said first face;
   said semiconductor substrate being doped a second conductivity type adjacent said orthogonally extending trench walls, from said first face to said trench bottoms, and being doped said second conductivity type adjacent said trench bottoms;
   a metal layer on said first face between said trenches, on said orthogonally extending trench walls and on said trench bottoms, said metal layer and said second conductivity type doping forming an ohmic contact at said orthogonally extending trench walls from said first face to said trench bottoms, and at said trench bottoms, said metal layer and said semiconductor substrate of first conductivity type forming a Schottky contact at said first face between said trenches; and
   an ohmic contact on said second face.

11. The semiconductor rectifier of claim 10 wherein said semiconductor substrate comprises a first portion of said first conductivity type adjacent said second face, and a second portion of said first conductivity type adjacent said first face, wherein said first portion is more heavily doped than said second portion.

12. The semiconductor rectifier of claim 10 wherein said trench bottoms are planar trench bottoms, extending parallel to said first face.

13. The semiconductor rectifier of claim 12 wherein said trenches are rounded at intersections of said trench bottoms and said orthogonally extending trench walls.

14. The semiconductor rectifier of claim 10 wherein said trench bottoms are nonplanar.

15. The semiconductor rectifier of claim 10 wherein said first conductivity type is N-type and wherein said second conductivity type is P-type.

16. The semiconductor rectifier of claim 10 wherein said metal layer is an aluminum layer.

* * * * *

UNITED STATES PATENT AND TRADEMARK OFFICE
CERTIFICATE OF CORRECTION

PATENT NO. : 5,241,195
DATED : August 31, 1993
INVENTOR(S) : Tu, et al.

It is certified that error appears in the above-identified patent and that said Letters Patent is hereby corrected as shown below:

In column 5, line 48, "14b" should be -- 14a --

In column 5, line 67, "p-I-N" should be -- P-I-N --

In column 7, line 7, after "11a" insert -- . --

In column 7, line 56, after "11d," delete paragraph

In column 7, line 57, "While" should be -- while --

In column 8, line 64, after "of" (first occurrence) add -- Claim 1 wherein said semiconductor substrate comprises a --

In column 9, line 20, delete "of" (first occurrence)

Signed and Sealed this

Tenth Day of May, 1994

Attest:

BRUCE LEHMAN

Attesting Officer

Commissioner of Patents and Trademarks